United States Patent
Fujimoto et al.

(10) Patent No.: US 10,201,078 B2
(45) Date of Patent: Feb. 5, 2019

(54) FLEXIBLE PRINTED CIRCUIT BOARD AND CARD READER

(71) Applicant: NIDEC SANKYO CORPORATION, Suwa-gun, Nagano (JP)

(72) Inventors: Masaya Fujimoto, Nagano (JP); Junro Takeuchi, Nagano (JP)

(73) Assignee: NIDEC SANKYO CORPORATION, Nagano (JP)

( * ) Notice: Subject to any disclaimer, the term of this patent is extended or adjusted under 35 U.S.C. 154(b) by 0 days.

(21) Appl. No.: 15/938,403

(22) Filed: Mar. 28, 2018

(65) Prior Publication Data

US 2018/0288871 A1   Oct. 4, 2018

(30) Foreign Application Priority Data

Mar. 30, 2017   (JP) .................. 2017-067135

(51) Int. Cl.
*H05K 1/02* (2006.01)
*G06K 7/08* (2006.01)
*H05K 1/11* (2006.01)

(52) U.S. Cl.
CPC ........... *H05K 1/0275* (2013.01); *G06K 7/087* (2013.01); *H05K 1/028* (2013.01); *H05K 1/118* (2013.01); *H05K 2201/09027* (2013.01); *H05K 2201/09227* (2013.01)

(58) Field of Classification Search
None
See application file for complete search history.

(56) References Cited

U.S. PATENT DOCUMENTS

2017/0132436 A1* 5/2017 Gomi .................. G06F 21/86
2018/0032764 A1* 2/2018 Kuwaki ............... G06K 7/00

FOREIGN PATENT DOCUMENTS

JP   2012204527 A   10/2012

* cited by examiner

*Primary Examiner* — Kristy A Haupt
(74) *Attorney, Agent, or Firm* — Cantor Colburn LLP

(57) ABSTRACT

A flexible printed circuit board may include a data signal circuit layer on which a data signal circuit is formed; and a destruction detection circuit layer on which a destruction detection circuit, structured to detect at least one of a break and a short-circuit of the destruction detection circuit layer, is formed, the destruction detection circuit layer overlapping the data signal circuit layer. The destruction detection circuit may be structured to carry destruction detection signals which are squarewave-shaped digital signals. The data signal circuit layer may include a first data signal circuit layer on which the data signal circuit is formed, the data signal circuit including linear-shaped first pattern wirings arranged parallel to one another. The destruction detection circuit may include a first destruction detection circuit layer including second pattern wirings formed by a linear portions orthogonally crossing the first pattern wirings and arcuate portions.

9 Claims, 7 Drawing Sheets

FLEXIBLE PRINTED CIRCUIT BOARD AND CARD READER

CROSS REFERENCE TO RELATED APPLICATION

The present application claims priority under 35 U.S.C. § 119 to Japanese Application No. 2017-067135 filed Mar. 30, 2017, the entire content of which is incorporated herein by reference.

BACKGROUND

1. Field of the Invention

At least an embodiment of the present invention relates to a flexible printed circuit board used in, for example, a card reader. At least an embodiment of the present invention also relates to a card reader that reads data recorded on a card and records data on a card.

2. Description of Related Documents

Flexible printed circuit boards used in card readers have been proposed (for example, see Japanese Unexamined Patent Application Publication No. 2012-204527). The flexible printed circuit board described in Japanese Unexamined Patent Application Publication No. 2012-204527 has a multilayer structure including a data signal layer, a break detection signal layer, and an insulation layer. The insulation layer, the break detection signal layer, the insulation layer, the data signal layer, the insulation layer, the break detection signal layer, and the insulation layer are stacked in this order to the back surface from the front surface of the flexible printed circuit board. A data signal circuit (a data signal pattern) for transferring data read from a card or data to be recorded on a card is formed on the data signal layer. A break detection signal circuit (a break detection signal pattern) for detecting a break of the break detection signal layer formed on the break detection signal layer.

In the flexible printed circuit board described in Japanese Unexamined Patent Application Publication No. 2012-204527, the data signal circuit is covered with a break detection signal circuit. Therefore, in this related-art flexible printed circuit board, if a malicious user attaches a signal line to the data signal circuit to maliciously acquire data from the data signal circuit, the break detection signal circuit is broken and it is detected that a malicious act is being performed on the flexible printed circuit board. Also, when it is detected that a malicious act is being performed on the flexible printed circuit board, malicious data acquisition from the data signal circuit can be avoided by performing predetermined processes.

In the flexible printed circuit board described in Japanese Unexamined Patent Application Publication No. 2012-204527, a data signal circuit is covered with a break detection signal circuit, and malicious data acquisition from the data signal circuit can be avoided as described above. In this related-art flexible printed circuit board, however, break detection signals which are squarewave-shaped digital signals flow through the break detection signal circuit covering the data signal circuit. Therefore, crosstalk may occur between the break detection signals flowing through the break detection signal circuit and data signals flowing through the data signal circuit.

If crosstalk occurs between the break detection signals flowing through the break detection signal circuit and the data signals flowing through the data signal circuit, data can no more be correctly read from a card, or correct data can no more be recorded on a card. Also, if crosstalk occurs between the break detection signals flowing through the break detection signal circuit and the data signals flowing through the data signal circuit, misdetection (detection of a break of the break detection signal circuit though the break detection signal circuit is not broken) may occur.

SUMMARY

At least an embodiment of the present invention provides a flexible printed circuit board on which a data signal circuit for transferring data signals and a destruction detection circuit for detecting a break or a short-circuit of the flexible printed circuit board are formed, in which malicious data acquisition from the data signal circuit can be avoided, and crosstalk between signals flowing through the data signal circuit and signals flowing through the destruction detection circuit can be reduced.

At least an embodiment of the present invention provides a card reader that includes a flexible printed circuit board on which a data signal circuit and a destruction detection circuit are formed, in which malicious data acquisition from the data signal circuit can be avoided, and crosstalk between signals flowing through the data signal circuit and signals flowing through the destruction detection circuit can be reduced.

To address the issues above, the flexible printed circuit board according to at least an embodiment of the present invention includes A flexible printed circuit board, which includes a data signal circuit layer on which a data signal circuit for transferring data signals is formed, and a destruction detection circuit layer on which a destruction detection circuit for detecting at least one of a break and a short-circuit of the destruction detection circuit layer is formed, the destruction detection circuit layer overlapping the data signal circuit layer. Destruction detection signals which are squarewave-shaped digital signals flow through the destruction detection circuit, the data signal circuit layer is at least partially a first data signal circuit layer on which the data signal circuit formed by a plurality of linear-shaped first pattern wirings arranged parallel to one another is formed, and the destruction detection circuit-formed by second pattern wirings formed by a combination of linear portions orthogonally crossing the first pattern wirings and arcuate portions is formed on a first destruction detection circuit layer which is a portion of the destruction detection circuit layer overlapping the first data signal circuit layer.

In the flexible printed circuit board of at least an embodiment of the present invention, the data signal circuit layer on which the data signal circuit is formed and the destruction detection circuit layer on which the destruction detection circuit is formed overlap each other. Therefore, in at least an embodiment of the present invention, if a malicious user tries to attach a signal line to the data signal circuit to maliciously acquire data from the data signal circuit, the destruction detection circuit may be broken or short-circuited, and it can be detected that a malicious act is being performed on the flexible printed circuit board. Also, when it is detected that a malicious act is being performed on the flexible printed circuit board, malicious data acquisition from the data signal circuit can be avoided by performing predetermined processes.

In at least an embodiment of the present invention, the data signal circuit layer is at least partially a first data signal circuit layer on which the data signal circuit formed by a plurality of linear-shaped first pattern wirings arranged parallel to one another is formed, and the destruction detection circuit formed by second pattern wirings formed by a combination of linear portions orthogonally crossing the first pattern wirings and arcuate portions is formed on a first destruction detection circuit layer which is a portion of the destruction detection circuit layer overlapping the first data signal circuit layer.

Therefore, in at least an embodiment of the present invention, the destruction detection circuit formed on the first destruction detection circuit layer has no linear portions parallel to the linear first pattern wirings formed in the first data signal circuit layer. Therefore, in at least an embodiment of the present invention, crosstalk between the destruction detection signals which are squarewave-shaped digital signals flowing through the destruction detection circuit and signals flowing through the data signal circuit can be reduced. That is, in at least an embodiment of the present invention, malicious data acquisition from the data signal circuit can be avoided, and crosstalk between the signals flowing through the data signal circuit and the destruction detection signals flowing through the destruction detection circuit can be reduced.

Also, by arranging a shielding layer on which a shielding circuit is formed between the data signal circuit layer and the destruction detection circuit layer, crosstalk between the signals flowing through the data signal circuit and the destruction detection signals flowing through the destruction detection circuit can be reduced. In this case, however, a cost of the flexible printed circuit board increases. Also, in this case, a thickness of the flexible printed circuit board increases and, as a result, flexibility of the flexible printed circuit board decreases.

In at least an embodiment of the present invention, the destruction detection circuit layer is desirably formed on one of the sides of the data signal circuit layer in the thickness direction of the flexible printed circuit board. With this configuration, compared to when the destruction detection circuit layer is formed on both sides of the data signal circuit layer in the thickness direction of the flexible printed circuit board, the cost of the flexible printed circuit board can be reduced. Also, with this configuration, compared to when the destruction detection circuit layer is formed on both sides of the data signal circuit layer in the thickness direction of the flexible printed circuit board, the thickness of the flexible printed circuit board can be reduced and, as a result, flexibility of the flexible printed circuit board can be increased.

In at least an embodiment of the present invention, for example, the flexible printed circuit board is formed in a band shape, the destruction detection circuit is formed by an outward pattern wiring and an inward pattern wiring pulled around between a first end and a second end in the longitudinal direction of the band-shaped flexible printed circuit, and the outward pattern wiring and the inward pattern wiring are connected to each other at the second end in the longitudinal direction of the flexible printed circuit board.

In at least an embodiment of the present invention, for example, the outward pattern wiring includes a plurality of first protruding portions protruding toward a second end from a first end in the width direction of the band-shaped flexible printed circuit board, and having the linear portions, and the inward pattern wiring includes a plurality of second protruding portions protruding toward the first end from the second end in the width direction of the flexible printed circuit board, and having the linear portions.

In at least an embodiment of the present invention, the first protruding portions and the second protruding portions are arranged alternately adjacent to each other in the longitudinal direction of the flexible printed circuit board. With this configuration, if a malicious user tries to attach a signal line to the data signal circuit to maliciously acquire data from the data signal circuit, the destruction detection circuit is easily short-circuited.

In at least an embodiment of the present invention, the outward pattern wiring desirably includes a first connecting portion that connects two first protruding portions arranged adjacent to each other in the longitudinal direction of the flexible printed circuit board at the first end in the width direction of the flexible printed circuit board, and the inward pattern wiring desirably includes a second connecting portion that connects two second protruding portions arranged adjacent to each other in the longitudinal direction of the flexible printed circuit board at the second end in the width direction of the flexible printed circuit board. The first connecting portion and the second connecting portion each are desirably formed in a wave shape formed by a plurality of arcuate portions. With this configuration, areas in which the destruction detection circuit is not formed at both ends of the destruction detection circuit layer in the width direction of the flexible printed circuit board can be reduced. Therefore, if a malicious user tries to attach a signal line to the data signal circuit to maliciously acquire data from the data signal circuit, the destruction detection circuit is easily broken or short-circuited.

In at least an embodiment of the present invention, each of the first protruding portions and each of the second protruding portions desirably include a plurality of linear portions and arcuate portions connecting the linear portions. At least one of the arcuate portions of each of the first protruding portions and at least one of the arcuate portions of each of the second protruding portions are desirably arranged adjacent to each other in the width direction of the flexible printed circuit board. With this configuration, areas in which the destruction detection circuit is not formed between the first protruding portion and the second protruding portion of the destruction detection circuit layer can be reduced. Therefore, if a malicious user tries to attach a signal line to a data signal circuit to maliciously acquire data from the data signal circuit, the destruction detection circuit is easily broken or short-circuited.

Also, to address the issues above, the card reader according to at least an embodiment of the present invention is a card reader that performs at least one of reading data recorded on a card and recording data on a card, which includes a flexible printed circuit board including a data signal circuit layer on which a data signal circuit for transferring at least one of signals of data read from the card and signals of data to be recorded on the card is formed, and a destruction detection circuit layer on which a destruction detection circuit for detecting at least one of a break and a short-circuit of the destruction detection circuit layer is formed, the destruction detection circuit layer overlapping the data signal circuit layer. Destruction detection signals which are squarewave-shaped digital signals flow through the destruction detection circuit. The data signal circuit layer is at least partially a first data signal circuit layer on which the data signal circuit formed by a plurality of linear-shaped first pattern wirings arranged parallel to one another is formed. The destruction detection circuit formed by second pattern wirings formed by a combination of linear portions and orthogonally crossing the first pattern wirings and arcuate portions is formed on a first destruction detection circuit layer which is a portion of the destruction detection circuit layer overlapping the first data signal circuit layer.

In the flexible printed circuit board the card reader of at least an embodiment of the present invention is equipped with, the destruction detection circuit layer on which the destruction detection circuit is formed and the data signal circuit layer on which the data signal circuit is formed overlap each other. Therefore, in at least an embodiment of the present invention, if a malicious user tries to attach a signal line to a data signal circuit to maliciously acquire data from the data signal circuit, the destruction detection circuit may be broken or short-circuited, and it can be detected that a malicious act is being performed on the flexible printed circuit board. Also, when it is detected that a malicious act is being performed on the flexible printed circuit board, malicious data acquisition from the data signal circuit can be avoided by performing predetermined processes.

In at least an embodiment of the present invention, the data signal circuit layer is at least partially a first data signal circuit layer on which the data signal circuit formed by a plurality of linear-shaped first pattern wirings arranged parallel to one another is formed, and the destruction detection circuit formed by second pattern wirings formed by a combination of linear portions orthogonally crossing the first pattern wirings and arcuate portions is formed on a first destruction detection circuit layer which is a portion of the destruction detection circuit layer overlapping the first data signal circuit layer.

Therefore, in at least an embodiment of the present invention, the destruction detection circuit formed on the first destruction detection circuit layer has no linear portions parallel to the linear first pattern wirings formed in the first data signal circuit layer. Therefore, in at least an embodiment of the present invention, crosstalk between the destruction detection signals which are squarewave-shaped digital signals flowing through the destruction detection circuit and signals flowing through the data signal circuit can be reduced. That is, in at least an embodiment of the present invention, malicious data acquisition from a data signal circuit can be avoided, and crosstalk between the signals flowing through the data signal circuit and the destruction detection signals flowing through the destruction detection circuit can be reduced.

In at least an embodiment of the present invention, the card reader includes, for example, a magnetic head that performs at least one of reading magnetic data recorded on a card and recording magnetic data on a card, and the flexible printed circuit board is connected to a magnetic head, and the data signal circuit transfers signals of the magnetic data. According to at least an embodiment of the present invention, crosstalk between the signals flowing through the data signal circuit and the destruction detection signals flowing through the destruction detection circuit can be reduced. Therefore, for example, magnetic data recorded on a card can be correctly read by using the magnetic head even if the amplitude of output signals of the magnetic head when reading the magnetic data recorded on the card is small.

As described above, in at least an embodiment of the present invention, malicious data acquisition from a data signal circuit can be avoided, and crosstalk between signals flowing through a data signal circuit and signals flowing through a destruction detection circuit can be reduced.

BRIEF DESCRIPTION OF DRAWINGS

Embodiments will now be described, by way of example only, with reference to the accompanying drawings which are meant to be exemplary, not limiting, and wherein like elements are numbered alike in several Figures, in which.

DETAILED DESCRIPTION

Below, embodiments of the present invention will be described with reference to the drawings.

Entire Configuration of Card Reader

Figure 1:
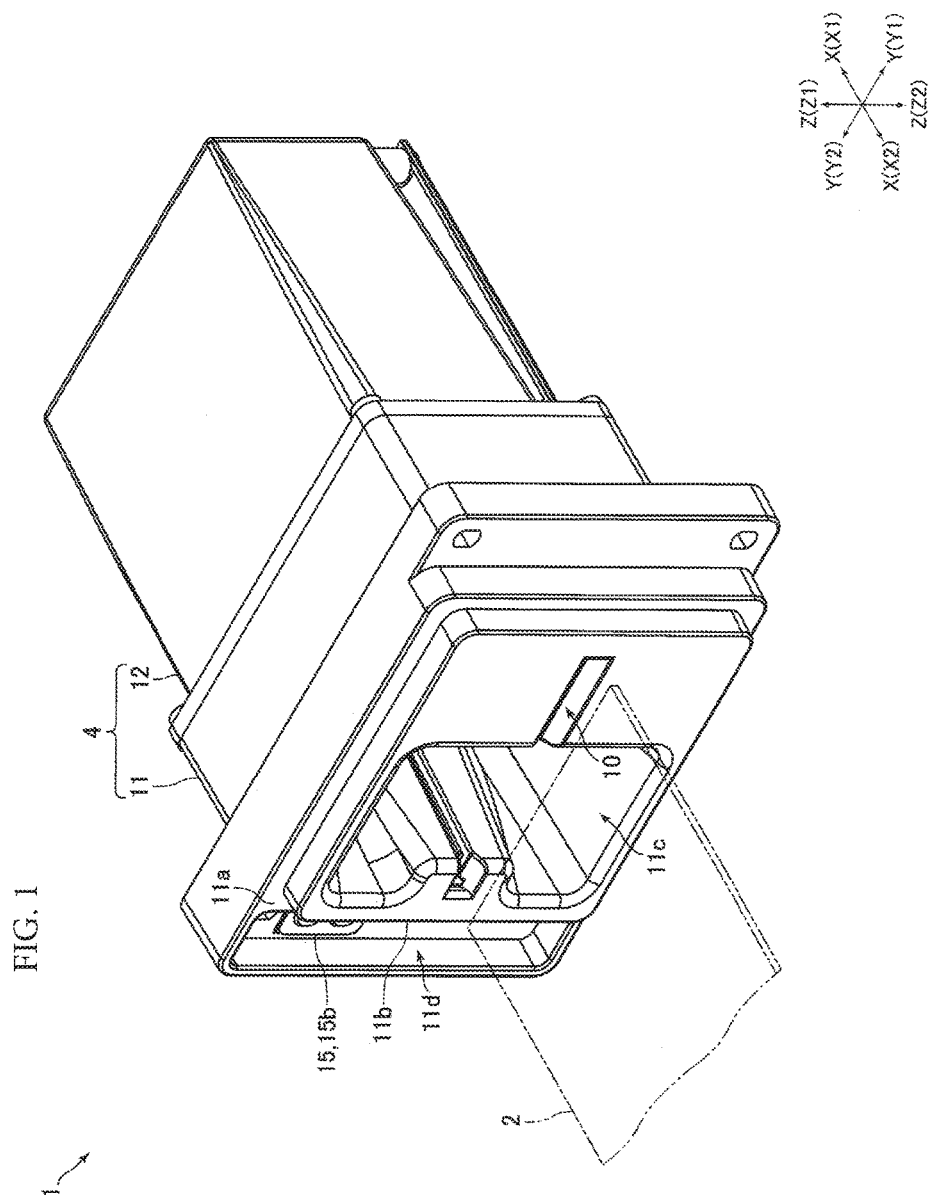
FIG. 1 is a perspective view of a card reader according to an embodiment of the present invention.
Figure 2:
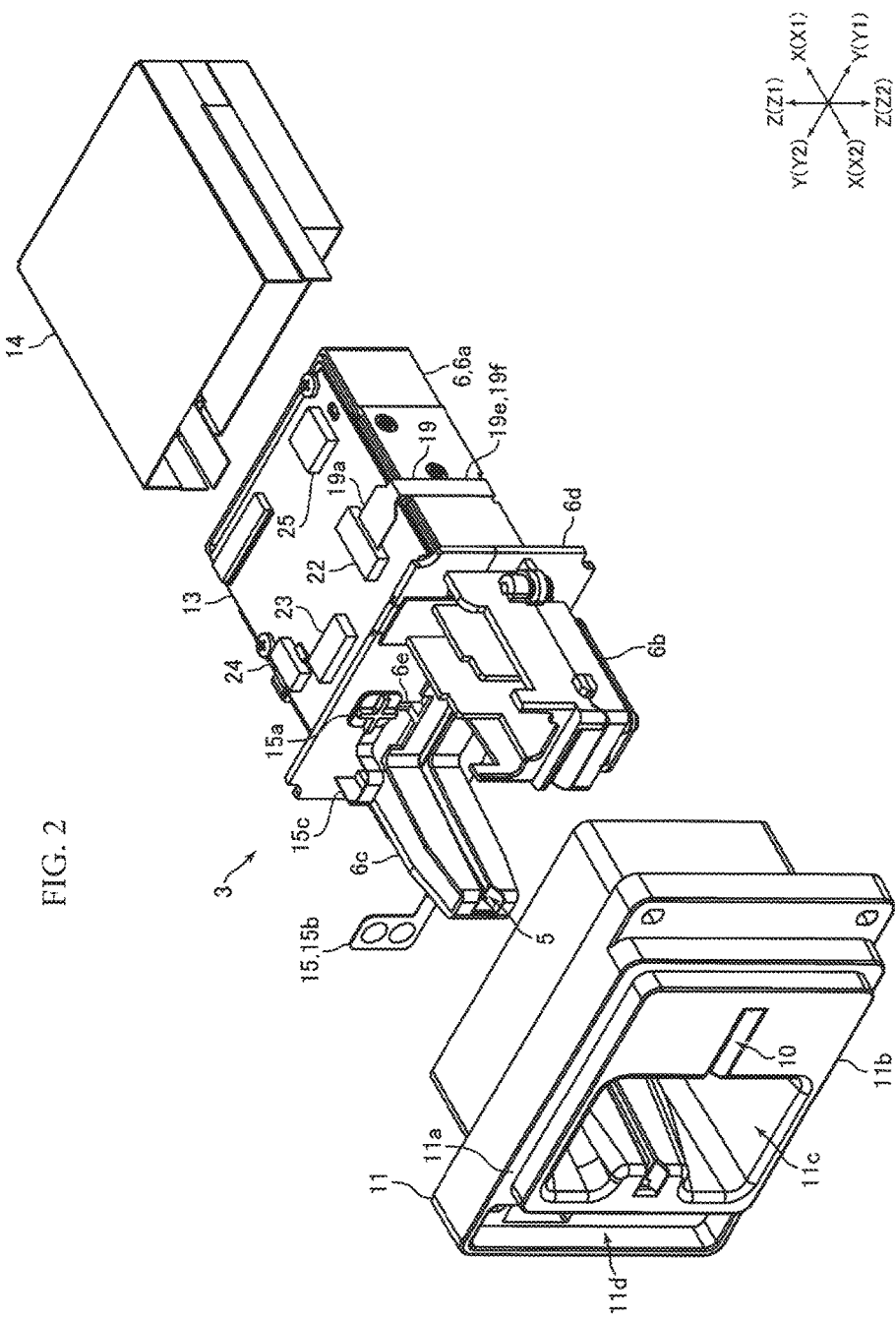
FIG. 2 is an exploded perspective view of the card reader of FIG. 1 a case main body removed therefrom.
Figure 3:
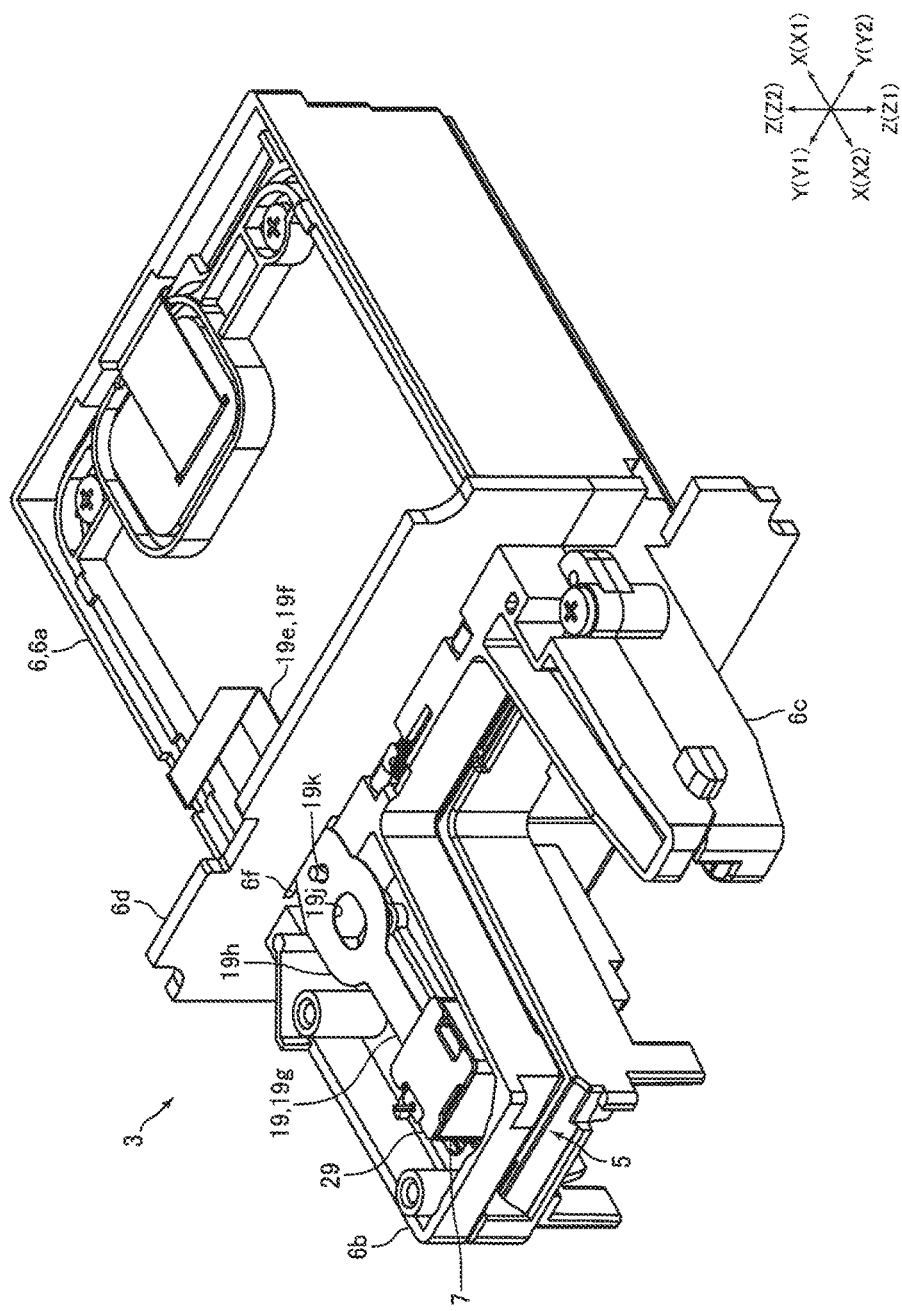
FIG. 3 is a perspective view of the card reader of FIG. 1 seen from another direction, a case body, a protection board, and the like removed therefrom.

FIG. 1 is a perspective view of a card reader 1 according to an embodiment of the present invention. FIG. 2 is an exploded perspective view of the card reader 1 of FIG. 1 a case main body 12 removed therefrom. FIG. 3 is a perspective view of the card reader 1 of FIG. 1 seen from another direction, a case body 4, a protection board 14, and the like removed therefrom.

The card reader 1 of the present embodiment is a device that reads data recorded on a card 2 or records data on the card 2. More specifically, the card reader 1 is a "dip type" card reader in which the card 2 is manually inserted into the card reader 1 and removed from the card reader 1 for reading and recording data. This card reader 1 is used in, for example, an upper-level device, such as a refueling device in an unmanned or self-service gas station, or an automatic teller machine (ATM).

The card 2 is, for example, a rectangular card made of vinyl chloride and has a thickness of approximately 0.7 to 0.8 mm. A magnetic stripe on which magnetic data is recorded is formed on one surface of the card 2. An IC chip is embedded in the card 2 and external connection terminals of the IC chip are formed on the other surface of the card 2. Note that the card 2 may be a card made of polyethylene terephthalate (PET) having a thickness of approximately 0.18 to 0.36 mm or a card made of paper having a predetermined thickness, and the like.

The card reader 1 includes a card reader main body 3 and a case body 4 that covers the card reader main body 3. The card reader main body 3 includes a main body frame 6 in which a card moving path 5 along which the card 2 moves is formed, a magnetic head 7 (see FIG. 3) that performs at least one of reading magnetic data recorded on the card 2 and recording the magnetic data on the card 2, and an IC contact block (not illustrated) including a plurality of IC contact springs for communicating data with the IC chip embedded in the card 2.

The case body 4 is formed by a front cover 11 and the case main body 12. An insertion opening 10 of the card 2 is formed in the front cover 11. As illustrated in FIG. 2, the card reader 1 includes a control board 13 that is a printed circuit board for control, a protection board 14 that is a printed circuit board for protecting the control board 13, and a sheet switch (a membrane switch) 15 for detecting that the front cover 11 has been removed and that the card reader 1 has been removed from an upper-level device.

In the present embodiment, the card 2 which is operated manually moves in an X direction illustrated in FIG. 1 and the like. That is, the X direction is a traveling direction of the card 2 moving along the card moving path 5. The card 2 is inserted in an X1 direction and is removed in an X2 direction. A Z direction in FIG. 1 and the like orthogonally crossing the X direction is a thickness direction of the card 2 moving along the card moving path 5, and a Y direction in FIG. 1 and the like orthogonally crossing the X direction and the Z direction is a width direction (a transverse direction) of the card 2 moving along the card moving path 5.

In the description below, the X direction is the front-rear direction, the Y direction is the left-right direction, and the Z direction is the up-down direction. The X1 direction side that is an insertion direction of the card 2 into the card reader 1 is the "rear (back)" side, and the X2 direction side that is a removal direction of the card 2 from the card reader 1 is the "front" side. The Y1 direction side that is one side in the left-right direction is the "right" side, the Y2 direction side that is the opposite side in the left-right direction is the "left" side, the Z1 direction side that is one side in the up-down direction is the "upper" side, and the Z2 direction side that is the opposite side in the up-down direction is the "lower" side.

The main body frame 6 includes a card holding portion 6a that holds a rear end portion of the card 2 inserted into the card reader 1 (that is, the card 2 inserted through the insertion opening 10), a head attaching portion 6b to which the magnetic head 7 is attached, and a card guide portion 6c that guides the card 2 inserted through the insertion opening 10. The head attaching portion 6b and the card guide portion 6c are arranged on the front side of the card holding portion 6a. A flange portion 6d extending in a flange shape is formed between the head attaching portion 6b and the card guide portion 6c, and the card holding portion 6a.

The flange portion 6d is formed in a substantially rectangular frame shape extending in the up-down and left-right directions from the front end of the card holding portion 6a. The head attaching portion 6b and card guide portion 6c protrude from the flange portion 6d to the front. The head attaching portion 6b and the card guide portion 6c are formed a predetermined distance apart in the left-right direction. In the present embodiment, the head attaching portion 6b is arranged on the right side, and the card guide portion 6c is arranged on the light side. The magnetic head 7 is attached on the front end of the head attaching portion 6b. The magnetic head 7 is arranged such that a magnetic gap of the magnetic head 7 faces the card moving path 5 from below. The IC contact block is attached to the card holding portion 6a.

The front cover 11 is arranged on the front side of the main body frame 6 and covers a front side of the main body frame 6. The front cover 11 forms the front side of the card reader 1. An attachment surface 11a of the card reader 1 with respect to an upper-level device is formed on the front side of the front cover 11. The attachment surface 11a is a flat surface that orthogonally crosses the front-rear direction. An exposed portion 11b is formed on the front side of the front cover 11. The exposed portion 11b is disposed inside an opening formed in the front panel of the upper-level device. The exposed portion 11b is formed to protrude to the front from the attachment surface 11a. When the card reader 1 is attached to an upper-level device, the exposed portion 11b forms a part of a front panel of the upper-level device.

In the front cover 11, a finger insertion portion 11c is formed recessed toward the rear from the front of the exposed portion 11b. The finger insertion portion 11c is sized to receive inserted user fingers. When the user inserts the card 2 into the card reader 1, and when the user removes the card 2 from the card reader 1, the user inserts the fingers into the finger insertion portion 11c. The insertion opening 10 is formed on a front side of the exposed portion 11b, and the left and right sides and the rear side of the finger insertion portion 11c. On the front side of the front cover 11, a recessed portion 11d is formed recessed toward the rear side from the attachment surface 11a. The recessed portion 11d is formed on a left side of the exposed portion 11b.

The case main body 12 is formed in a substantially rectangular parallelepiped box-shape opened at the front end. The front cover 11 and the case main body 12 are fixed to each other a rear end of the front cover 11 and a front end of the case main body 12 being in contact with each other. The case body 4 covers the upper and lower sides, the left and right sides, and the front and rear sides of the card reader main body 3.

The control board 13 is a rigid board formed in a substantially rectangular flat plate shape. The control board 13 is fixed to an upper surface of the card holding portion 6a. The magnetic head 7 is electrically connected to the control board 13 via the flexible printed circuit board 19. The IC contact block is also electrically connected to the control board 13 via the flexible printed circuit board 19. As illustrated in FIG. 2, a connector 22 to which the flexible printed circuit board 19 is connected, a connector 23 to which the protection board 14 is connected, and a connector 24 to which the sheet switch 15 is connected are mounted on the control board 13. Also, a battery 25 that supplies electric power to the sheet switch 15 is mounted on the control board.

The control board 13 includes a data signal circuit layer on which a data signal circuit that transfers signals of magnetic data (data signals) read from the magnetic stripe of the card 2 by using the magnetic head 7 and signals of data to record on the magnetic stripe of the card 2 by using the magnetic head 7 is formed. Also, the control board 13 includes a data signal circuit layer on which a data signal circuit that transfers signals of data (data signals) read from the IC chip of the card 2 by using an IC contact spring and signals of data to record on the IC chip of the card 2 by using the IC contact spring is formed.

The protection board 14 is a flexible printed circuit board. The protection board 14 includes a destruction detection circuit layer on which a destruction detection circuit for detecting a break or a short-circuit of the destruction detection circuit is formed, and an insulation layer arranged on both sides of the destruction detection circuit layer. The destruction detection circuit is formed in substantially the entire area of the protection board 14. Also, the destruction detection circuit is connected to the battery 25. The protection board 14 is arranged to surround the card holding portion 6a and the control board 13 from the upper and lower sides, the left and right sides, and the rear side, and surrounds the card holding portion 6a and the control board 13 from the upper, lower, left, right, and rear sides.

The sheet switch 15 includes a switch portion 15a for detecting that the front cover 11 is removed, a switch portion 15b for detecting that the card reader 1 is removed from an upper-level device, and a band-shaped connecting portion 15c that connects the switch portions 15a and 15b to the control board 13. The switch portions 15a and 15b are contact-type detection switches including contact electrodes, and the like.

The switch portion 15a is fixed to an upper end of the rear surface of the front cover 11. When the front cover 11 and the case main body 12 are fixed to each other, the contact electrodes of the switch portion 15a are pressed to the front by a protruding portion 6e (see FIG. 2) formed on the front side of the flange portion 6d of the main body frame 6, causing the switch portion 15a to be conducting. When the front cover 11 is removed, the contact electrodes of the switch portion 15a are no more pressed by the protruding portion 6e, causing the switch portion 15a to be non-conducting. Therefore, it is detected that the front cover 11 is removed.

The switch portion 15b is fixed to a bottom surface (a rear surface) of the recessed portion 11d of the front cover 11. When the card reader 1 is attached to an upper-level device, the contact electrodes of the switch portion 15b are pressed to the rear by a protruding portion (not illustrated) formed on the rear surface of the front panel of an upper-level device, causing the switch portion 15b conducting. When the card reader 1 is removed from an upper-level device, the contact electrodes of the switch portion 15b are no more pressed by the protruding portion of an upper-level device, causing the switch portion 15b to be non-conducting. Therefore, it is detected that the card reader 1 is removed from an upper-level device.

In the present embodiment, if any kind of malicious act is performed by a malicious user to maliciously acquire data and, a break or a short-circuit of the destruction detection circuit of the protection board 14 is detected, a break or a short-circuit of a later-described destruction detection circuit 33 formed on the flexible printed circuit board 19 is detected, removal of the card reader 1 from an upper-level device is detected, and removal of the front cover 11 is detected, predetermined processes including deleting data stored in the control board 13, causing the control board 13 to be unusable, and notifying an upper-level device of abnormality, are performed.

Configuration of Flexible Printed Circuit Board

Figure 4A:
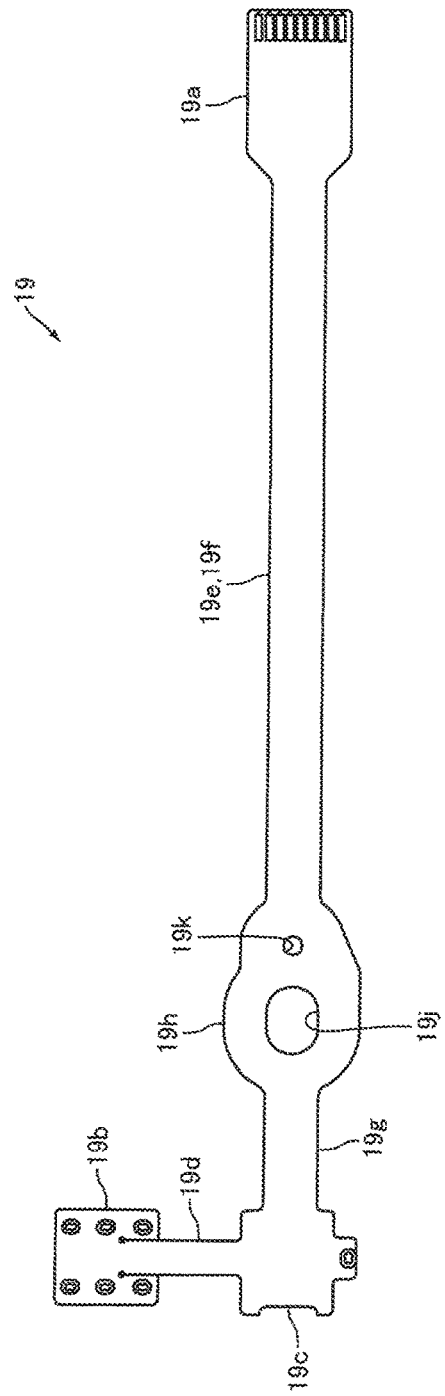
FIG. 4A is a developed view of a flexible printed circuit board of FIG. 3.
Figure 4B:
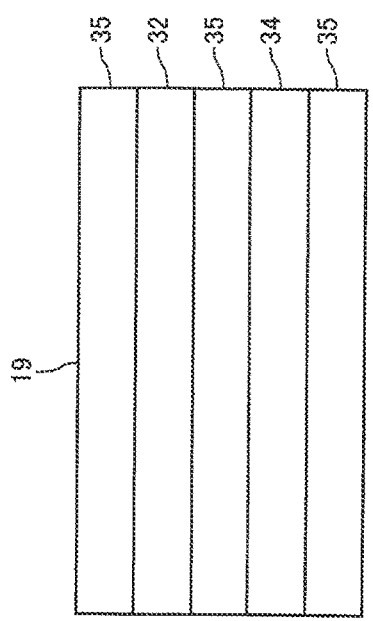
FIG. 4B is a cross-sectional view illustrating a configuration of the flexible printed circuit board of FIG. 3.
Figure 5A:
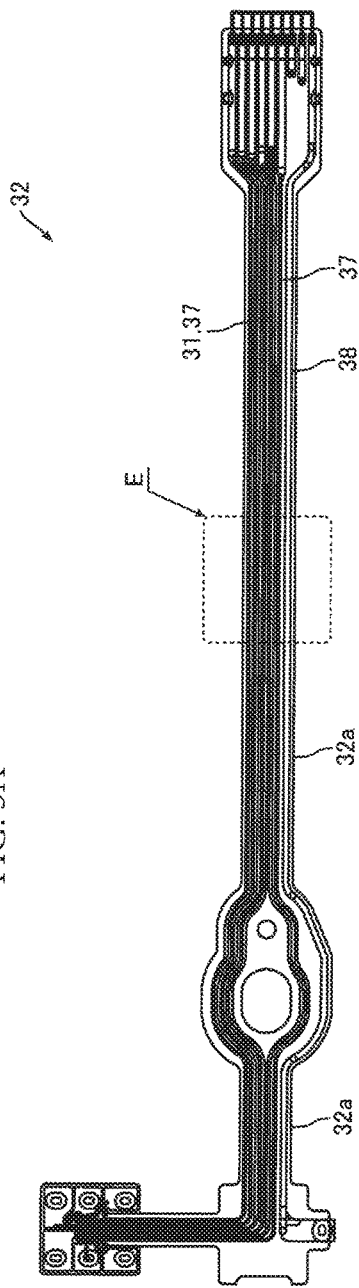
FIG. 5A is a developed view of a data signal circuit layer of FIG. 4B.
Figure 5B:
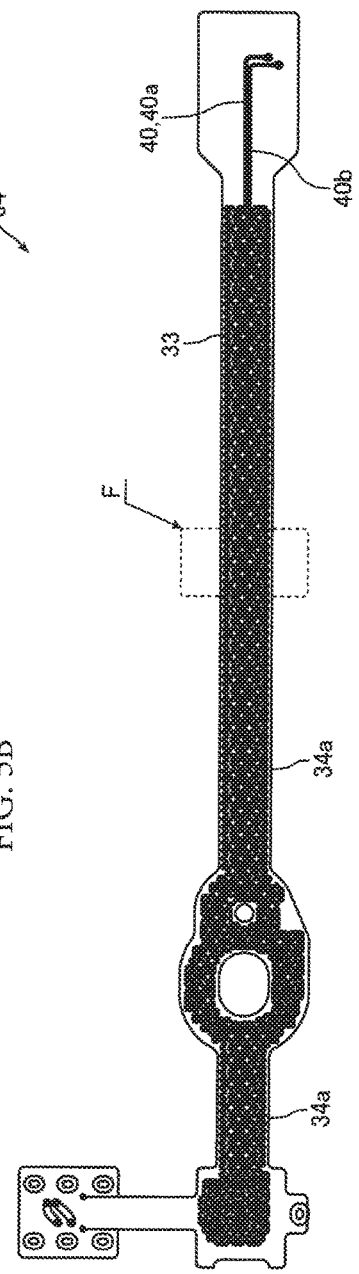
FIG. 5B is a developed view of a destruction detection circuit layer of FIG. 4B.
Figure 6:
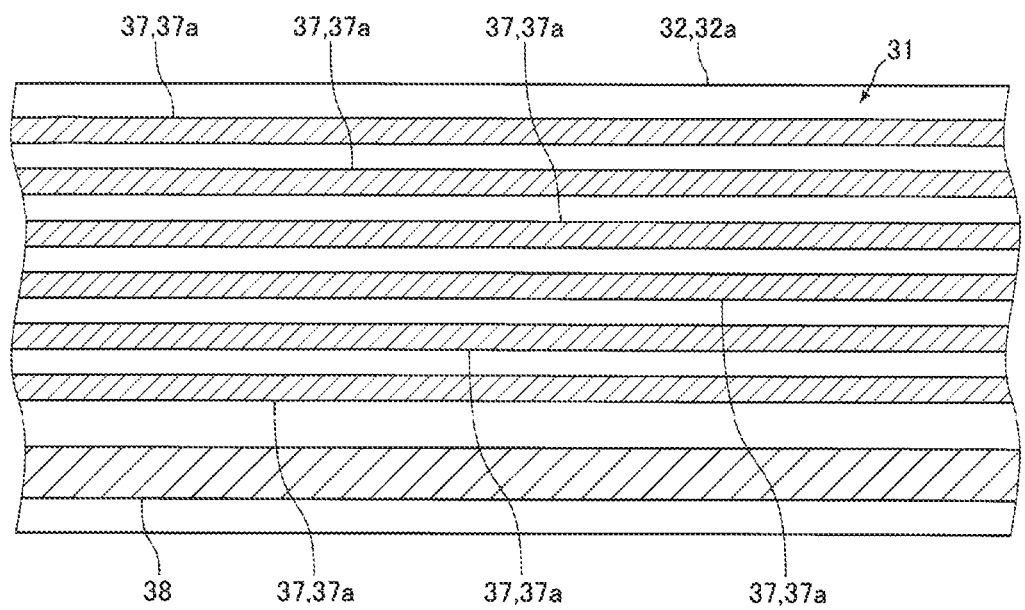
FIG. 6 is an enlarged view of a part "E" of FIG. 5A.
Figure 7:
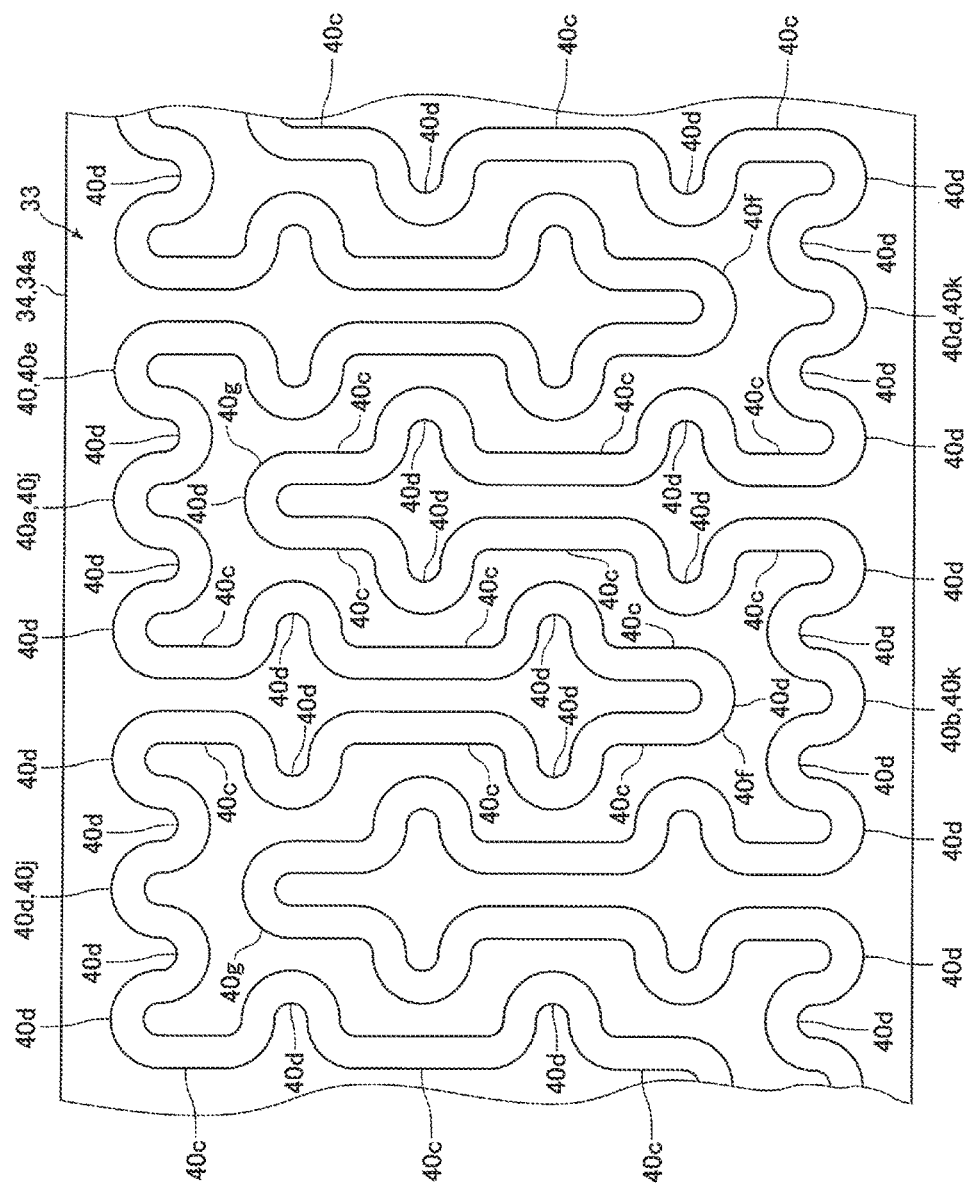
FIG. 7 is an enlarged view of a part "F" of FIG. 5B.

FIG. 4A is a developed view of the flexible printed circuit board 19 of FIG. 3, and FIG. 4B is a cross-sectional view illustrating a configuration of the flexible printed circuit board 19 of FIG. 3. FIG. 5A is a developed view of a data signal circuit layer 32 illustrated in FIG. 4B, and FIG. 5B is a developed view of a destruction detection circuit layer 34 illustrated in FIG. 4B. FIG. 6 is an enlarged view of a part E of FIG. 5A. FIG. 7 is an enlarged view of a part F of FIG. 5B.

The flexible printed circuit board 19 (hereinafter, "FPC 19") is formed in a band shape. A first end of the FPC 19 is connected to the connector 22. A second end of the FPC 19 is connected to the magnetic head 7. The FPC 19 is pulled around along the main body frame 6 in a state bent in a predetermined shape. The FPC 19 includes a connected portion 19a connected to the connector 22, a connected portion 19b connected to the magnetic head 7, a cover portion 19c that covers the connected portion 19b, a connecting portion 19d that connects the connected portion 19b and the cover portion 19c, and a connecting portion 19e that connects the connected portion 19a and the cover portion 19c.

The connected portion 19a is formed in a substantially rectangular shape. The connected portion 19b and the cover portion 19c are formed in a substantially square shape. The connecting portion 19d is formed in a linear shape. The connecting portion 19e is formed by a linear-shaped first linear connecting portion 19f and a linear-shaped second linear connecting portion 19g, and a substantially oval-shaped oval connecting portion 19h arranged between the first linear connecting portion 19f and the second linear connecting portion 19g. A first end of the first linear connecting portion 19f is connected to the connected portion 19a, and a second end of the first linear connecting portion 19f is connected to the oval connecting portion 19h. A first end of the second linear connecting portion 19g is connected to the cover portion 19c, and a second end of the second linear connecting portion 19g is connected to the oval connecting portion 19h.

The first linear connecting portion 19f and the second linear connecting portion 19g are arranged on the same line when the FPC 19 is developed. The connecting portion 19d orthogonally crosses the second linear connecting portion 19g when the FPC 19 is developed. Two through holes 19j and 19k are formed in the oval connecting portion 19h.

The connected portion 19b is soldered to a lower end of the magnetic head 7. The cover portion 19c covers the connected portion 19b from below. The connecting portion 19d is bent so that the connected portion 19b is covered by the cover portion 19c. The connected portion 19b, the connecting portion 19d and the cover portion 19c are covered by a sealing member (not illustrated). As illustrated in FIG. 3, a cover 29 that covers the cover portion 19c from below is fixed to a lower end of the magnetic head 7.

The connecting portion 19e is pulled around to the rear from the magnetic head 7. In the present embodiment, the second linear connecting portion 19g and the oval connecting portion 19h are arranged on the front side of the flange portion 6d of the main body frame 6, and the first linear connecting portion 19f is arranged on the rear side of the flange portion 6d. The flange portion 6d includes a through hole 6f (see FIG. 3) that penetrates the flange portion 6d in the front-rear direction, and the connecting portion 19e is pulled around to pass through the through hole 6f. The connected portion 19a is inserted into the connector 22.

The FPC 19 includes the data signal circuit layer 32, the destruction detection circuit layer 34, and an insulation layer 35. On the data signal circuit layer 32, a data signal circuit 31 for transferring data signals (more specifically, transferring at least one of signals of data read from the card 2 and signals of data to be recorded on the card 2) is formed. On the destruction detection circuit layer 34, the destruction detection circuit 33 for detecting a break or a short-circuit of the destruction detection circuit layer 34 is formed. The insulation layer 35 protects the data signal circuit layer 32 and the destruction detection circuit layer 34.

As illustrated in FIG. 4B, the insulation layer 35, the data signal circuit layer 32, the insulation layer 35, the destruction detection circuit layer 34, and the insulation layer 35 are stacked in this order from a first surface to a second surface of the FPC 19. That is, the destruction detection circuit layer 34 is stacked on the data signal circuit layer 32 via the insulation layer 35. The destruction detection circuit layer 34 is formed on one of the sides of the data signal circuit layer 32 in the thickness direction of the FPC 19. As illustrated in FIGS. 5A and 5B, an outer shape of the data signal circuit layer 32 and an outer shape of the destruction detection circuit layer 34 are substantially the same as an outer shape of the FPC 19. Also, an outer shape of the insulation layer 35 is substantially the same as the outer shape of the FPC 19.

The data signal circuit 31 transfers signals of magnetic data. The data signal circuit 31 is formed by a plurality of pattern wirings 37. In the present embodiment, the magnetic head 7 is a magnetic head with three-channels, and the data signal circuit 31 is formed by six pattern wirings 37. A first end of the pattern wiring 37 is connected to the magnetic head 7 and a second end of the pattern wiring 37 is connected to the control board 13. As illustrated in FIG. 5A, the data signal circuit 31 is formed in substantially the entire area of the data signal circuit layer 32. Also, a grounded circuit 38 is formed in the data signal circuit layer 32 in addition to the data signal circuit 31.

In the first linear connecting portion 19f and the second linear connecting portion 19g, six pattern wirings 37 are formed in a linear shape and are arranged parallel to one another. That is, when a part of the pattern wiring 37 arranged in the first linear connecting portion 19f and a part of the pattern wiring 37 arranged in the second linear connecting portion 19g are a first pattern wiring 37a (see FIG. 6), the data signal circuit 31 is formed by the six linear first pattern wirings 37a that are parallel to one another in the first linear connecting portion 19f and the second linear connecting portion 19g. The six first pattern wirings 37a are formed in a linear shape along a longitudinal direction (that is, parallel to the longitudinal direction) of the first linear connecting portion 19f and the second linear connecting portion 19g.

In the present embodiment, a part of the data signal circuit layer 32 arranged in the first linear connecting portion 19f and a part of the data signal circuit layer 32 arranged in the second linear connecting portion 19g are a first data signal circuit layer 32a on which the data signal circuit 31 formed by the six first pattern wirings 37a is formed. That is, a part of the data signal circuit layer 32 is the first data signal circuit layer 32a on which the data signal circuit 31 formed by the six first pattern wirings 37a is formed. In the first linear connecting portion 19f and the second linear connecting portion 19g, the grounded circuit 38 is linear-shaped and parallel to the six pattern wirings 37.

Destruction detection signals that are squarewave-shaped digital signals flow through the destruction detection circuit 33. As illustrated in FIG. 5B, the destruction detection circuit 33 is formed on the destruction detection circuit layer 34 at portions of the connected portion 19a, the cover portion 19c, and the connecting portion 19e. The destruction detection circuit 33 is formed by a single pattern wiring 40. A first end of the pattern wiring 40 is connected to a destruction detection circuit formed on the control board 13, and a second end of the pattern wiring 40 is grounded. Also, a first end of the pattern wiring 40 is connected to the battery 25 via the destruction detection circuit of the control board 13.

The pattern wiring 40 is pulled around from a first end toward a second end in the longitudinal direction of the band-shaped FPC 19, bent at the second end in the longitudinal direction of the FPC 19, and then pulled around to the second end in the longitudinal direction of the FPC 19. That is, the pattern wiring 40 is formed by an outward pattern wiring 40a and an inward pattern wiring 40b pulled around between the first end and the second end in the longitudinal direction of the band-shaped FPC 19. The outward pattern wiring 40a and the inward pattern wiring 40b are connected to each other at the second end in the longitudinal direction of the FPC 19. More specifically, the outward pattern wiring 40a and the inward pattern wiring 40b are connected at the cover portion 19c. As described above, the destruction detection circuit 33 is formed by the outward pattern wiring 40a and the inward pattern wiring 40b.

In the first linear connecting portion 19f and the second linear connecting portion 19g, the pattern wiring 40 is formed by a combination of linear portions 40c which orthogonally cross the first pattern wiring 37a (orthogonally cross the longitudinal direction of the first linear connecting portion 19f and the second linear connecting portion 19g) and arcuate portions 40d (see FIG. 7). That is, when a part of the pattern wiring 40 arranged in the first linear connecting portion 19f and, a part of the pattern wiring 40 arranged in the second linear connecting portion 19g are a second pattern wiring 40e, the destruction detection circuit 33 is formed by a second pattern wiring 40e formed by a combination of the linear portions 40c and the arcuate portions 40d in the first linear connecting portion 19f and the second linear connecting portion 19g.

In the present embodiment, a part of the destruction detection circuit layer 34 in the first linear connecting portion 19f and in the second linear connecting portion 19g are a first destruction detection circuit layer 34a of the destruction detection circuit layer 34 that overlaps the first data signal circuit layer 32a. On the first destruction detection circuit layer 34a, the destruction detection circuit 33 formed by the second pattern wiring 40e formed by a combination of the linear portions 40c and the arcuate portions 40d is formed.

In the first linear connecting portion 19f and the second linear connecting portion 19g, the outward pattern wiring 40a includes a plurality of first protruding portions 40f protruding toward the second end from the first end of the band-shaped FPC 19 in the width direction (the width direction of the linear-shaped first linear connecting portion 19f and the linear-shaped second linear connecting portion 19g) and having linear portions 40c. Also, in the first linear connecting portion 19f and the second linear connecting portion 19g, the inward pattern wiring 40b includes a plurality of second protruding portions 40g protruding toward the first end from the second end of the FPC 19 in the width direction and having the linear portions 40c. That is, the second pattern wiring 40e includes a plurality of first protruding portions 40f and a plurality of second protruding portions 40g.

As illustrated in FIG. 7, each of the first protruding portions 40f and each of the second protruding portions 40g include a plurality of linear portions 40c and arcuate portions 40d connecting the linear portions 40c. More specifically, each of the first protruding portions 40f and each of the second protruding portions 40g are formed by six linear portions 40c and five arcuate portions 40d connecting each of the six linear portions 40c. More specifically, each of the first protruding portions 40f and each of the second protruding portions 40g are formed by three linear portions 40c arranged on the same line, three linear portions 40c arranged parallel to each of the above-mentioned three linear portions 40c, and five arcuate portions 40d connecting the six linear portions 40c. The four arcuate portions 40d among the five arcuate portions 40d curve toward the longitudinal direction of the FPC 19, and the last one of the arcuate portions 40d curves toward the width direction of the FPC 19.

In the first linear connecting portion 19f and the second linear connecting portion 19g, the first protruding portions 40f and the second protruding portions 40g are arranged alternately adjacent to each other in the longitudinal direction of the FPC 19. Each of the four linear portions 40c among the six linear portions 40c that form the first protruding portion 40f, and each of the four arcuate portions 40d curving toward the longitudinal direction of the FPC 19 among the five arcuate portions 40d that form the second protruding portions 40g are arranged adjacent to each other in the longitudinal direction of the FPC 19.

Similarly, each of the four linear portions 40c among the six linear portions 40c that form the second protruding portions 40g, and each of the four arcuate portions 40d curving toward the longitudinal direction of the FPC 19 among the five arcuate portions 40d that form the first protruding portion 40f are arranged adjacent to each other in the longitudinal direction of the FPC 19. Also, the arcuate portions 40d of the first protruding portion 40f curving toward the longitudinal direction of the FPC 19, and the arcuate portions 40d of the second protruding portion 40g curving toward the longitudinal direction of the FPC 19 are arranged alternately adjacent to each other in the width direction of the FPC 19.

In the first linear connecting portion 19f and the second linear connecting portion 19g, the outward pattern wiring 40a includes a first connecting portion 40j connecting two first protruding portions 40f adjacent to each other in the longitudinal direction of the FPC 19 at the first end in the width direction of the FPC 19, and the inward pattern wiring 40b includes a second connecting portion 40k connecting two second protruding portions 40g adjacent to each other in the longitudinal direction of the FPC 19 at the second end of the width direction of the FPC 19.

The first connecting portion 40j and the second connecting portion 40k each are formed in a wave shape formed by a plurality of arcuate portions 40d. More specifically, the first connecting portion 40j and the second connecting portion 40k each are formed in a wave shape formed by five arcuate portions 40d. In the first connecting portion 40j and the second connecting portion 40k, two arcuate portions 40d arranged adjacent to each other in the longitudinal direction of the FPC 19 curve toward different directions in the width direction of the FPC 19.

The arcuate portion 40d of the first protruding portion 40f curving toward the width direction of the FPC 19 is arranged, in the longitudinal direction of the FPC 19, between two arcuate portions 40d of the second connecting portion 40k that curve inward in the width direction of the FPC 19. The arcuate portion 40d of the second protruding portions 40g curving toward the width direction of the FPC 19 is arranged, in the longitudinal direction of the FPC 19, between two arcuate portions 40d of the first connecting portion 40j that curve inward in the width direction of the FPC 19.

In the present embodiment, the connected portion 19b arranged on the front side of the flange portion 6d of the main body frame 6, the cover portion 19c, the second linear connecting portion 19g, and the oval connecting portion 19h are arranged so that the up-down direction of the FPC 19 corresponds to the thickness direction of the FPC 19. In the cover portion 19c, the second linear connecting portion 19g, and the oval connecting portion 19h, the destruction detection circuit layer 34 is arranged below the data signal circuit layer 32. That is, on the front side of the flange portion 6d which is not covered with the protection board 14, the FPC 19 is pulled around so that the data signal circuit layer 32 is arranged on the main body frame 6 side and the destruction detection circuit layer 34 is arranged on the outer side of the card reader 1.

Main Effect of Present Embodiment

As described above, in the FPC 19 of the present embodiment, the data signal circuit layer 32 on which the data signal circuit 31 is formed and the destruction detection circuit layer 34 on which the destruction detection circuit 33 is formed overlap each other. Therefore, in the present embodiment, if a malicious user tries to attach a signal line to the data signal circuit 31 to maliciously acquire data from the data signal circuit 31, the destruction detection circuit 33 may be broken or short-circuited, and it can be detected that a malicious act is being performed on the FPC 19. In the present embodiment, by performing predetermined processes when a break or a short-circuit of the destruction detection circuit 33 is detected, malicious data acquisition from the data signal circuit 31 can be avoided.

In the present embodiment, the data signal circuit 31 is formed by the six linear first pattern wirings 37a that are parallel to one another in the first linear connecting portion 19f and the second linear connecting portion 19g. The destruction detection circuit 33 is formed by the second pattern wiring 40e formed by a combination of the linear portions 40c which orthogonally crosses the first pattern wiring 37a and the arcuate portions 40d. That is, in the present embodiment, the destruction detection circuit 33 has no linear portions parallel to the first pattern wirings 37a in the first linear connecting portion 19f and the second linear connecting portion 19g.

Therefore, in the present embodiment, crosstalk between destruction detection signals which are squarewave-shaped digital signals flowing through the destruction detection circuit 33 and signals flowing through the data signal circuit 31 can be reduced. That is, in the present embodiment, malicious data acquisition from the data signal circuit 31 can be avoided, and crosstalk between signals flowing through the data signal circuit 31 and the destruction detection signals flowing through the destruction detection circuit 33 can be reduced. In the present embodiment, crosstalk between signals flowing through the data signal circuit 31 and the destruction detection signals flowing through the destruction detection circuit 33 can be reduced. Therefore, for example, magnetic data recorded on the card 2 can be correctly read by using the magnetic head 7 even if the amplitude of the output signals of the magnetic head 7 when reading the magnetic data recorded on the card 2 is small.

Also by arranging a shielding layer between the data signal circuit layer 32 and the destruction detection circuit layer 34, crosstalk between the signals flowing through the data signal circuit 31 and the destruction detection signals flowing through the destruction detection circuit 33 can be reduced. A shielding circuit is formed on the shielding layer. In this case, however, the cost of the FPC 19 increases. Also, in this case, a thickness of the FPC 19 increases and, as a result, flexibility of the FPC 19 decreases.

In the present embodiment, the destruction detection circuit layer 34 is formed on one of the sides of the data signal circuit layer 32 in the thickness direction of the FPC 19. Therefore, in the present embodiment, compared to when the destruction detection circuit layer 34 is formed on both sides of the data signal circuit layer 32 in the thickness direction of the FPC 19, the cost of the FPC 19 can be reduced. Also, compared to when the destruction detection circuit layer 34 is formed on both sides of the data signal circuit layer 32 in the thickness direction of the FPC 19, the thickness of the FPC 19 can be reduced and, as a result, flexibility of the FPC 19 can be increased.

In the present embodiment, the first protruding portions 40f and the second protruding portions 40g are arranged alternately adjacent to each other in the longitudinal direction of the FPC 19 in the first linear connecting portion 19f and the second linear connecting portion 19g. Therefore, in the present embodiment, if a malicious user tries to attach a signal line to the data signal circuit 31 to maliciously acquire data from the data signal circuit 31, the destruction detection circuit 33 is easily short-circuited.

In the present embodiment, the first connecting portion 40*j* and the second connecting portion 40*k* each are formed in a wave shape form by five arcuate portions 40*d*. Therefore, in the present embodiment, areas in which the destruction detection circuit 33 is not formed at the both ends of the destruction detection circuit layer 34 in the width direction of the FPC 19 can be reduced. Therefore, in the present embodiment, if a malicious user tries to attach a signal line to the data signal circuit 31 to maliciously acquire data from the data signal circuit 31, the destruction detection circuit 33 is easily broken or short-circuited.

In the present embodiment, the arcuate portion 40*d* of the first protruding portion 40*f* curving toward the longitudinal direction of the FPC 19 and the arcuate portion 40*d* of the second protruding portions 40*g* curving toward the longitudinal direction of the FPC 19 are arranged alternately to each other in the width direction of the FPC 19. Therefore, areas in which the destruction detection circuit 33 is not formed at both ends of the destruction detection circuit layer 34 between the first protruding portion 40*f* and the second protruding portion 40*g* can be reduced. Therefore, in the present embodiment, if a malicious user tries to attach a signal line to the data signal circuit 31 to maliciously acquire data from the data signal circuit 31, the destruction detection circuit 33 is easily broken or short-circuited.

Other Embodiments

A desirable embodiment of the invention has been described, but the described embodiment is merely illustrative. Various modifications may be made within the spirit and scope of the invention.

In the above embodiment, the first protruding portions 40*f* and the second protruding portions 40*g* are arranged alternately adjacent to each other in the longitudinal direction of the FPC 19 in the first linear connecting portion 19*f* and the second linear connecting portion 19*g*. However, the first protruding portions 40*f* and the second protruding portions 40*g* do not necessarily have to be arranged alternately adjacent to each other in the longitudinal direction of the FPC 19. For example, in the first linear connecting portion 19*f* and the second linear connecting portion 19*g*, two or more first protruding portions 40*f* and two or more second protruding portions 40*g* may be alternately arranged in the longitudinal direction of the FPC 19, two or more first protruding portions 40*f* and a single second protruding portion 40*g* may be alternately arranged in the longitudinal direction of the FPC 19, and a single first protruding portion 40*f* and two or more second protruding portions 40*g* may be alternately arranged in the longitudinal direction of the FPC 19. The first protruding portion 40*f* and the second protruding portion 40*g* do not necessarily have to be arranged adjacent to each other in the longitudinal direction of the FPC 19.

In the above embodiment, the destruction detection circuit layer 34 may be formed on both sides of the data signal circuit layer 32 in the thickness direction of the FPC 19. Also, in the above embodiment, each of the first protruding portions 40*f* and each of the second protruding portions 40*g* are formed by six linear portions 40*c* and five arcuate portions 40*d*. Each of the first protruding portions 40*f* and each of the second protruding portions 40*g* may be formed by, for example, two linear portions 40*c* arranged in parallel to each other, and a single arcuate portion 40*d* connecting these two linear portions 40*c* and curving toward the width direction of the FPC 19.

In the above embodiment, if the entire connecting portion 19*e* of the FPC 19 is formed in a linear shape, the data signal circuit layer 32 corresponding to the connecting portion 19*e* may be the first data signal circuit layer 32*a* on which the data signal circuit 31 formed by the six linear first pattern wirings 37*a* arranged parallel to one another is formed. In this case, the destruction detection circuit layer 34 corresponding to the connecting portion 19*e* is the first destruction detection circuit layer 34*a*, and the destruction detection circuit 33 formed by the second pattern wiring 40*e* formed by a combination of the linear portions 40*c* and the arcuate portions 40*d* is formed in the first destruction detection circuit layer 34*a*.

Also, if the entire FPC 19 is formed in a linear shape, the entire data signal circuit layer 32 may be the first data signal circuit layer 32*a* on which the data signal circuit 31 formed by the six linear first pattern wirings 37*a* arranged parallel to one another is formed. In this case, the entire destruction detection circuit layer 34 is the first destruction detection circuit layer 34*a*, and the destruction detection circuit 33 formed by the second pattern wiring 40*e* formed by a combination of the linear portions 40*c* and the arcuate portions 40*d* is formed in the first destruction detection circuit layer 34*a* (that is, in the entire destruction detection circuit layer 34).

In the above embodiment, a break and a short-circuit of the destruction detection circuit 33 are detected by using the destruction detection circuit 33 formed on the FPC 19. However, one of a break and a short-circuit of the destruction detection circuit 33 may be detected by using the destruction detection circuit 33. In the above embodiment, the card reader main body 3 does not necessarily have to include the IC contact block. Also, in the above embodiment, the card reader 1 may be a card transportation-type card reader equipped with a card transport mechanism that automatically transports the card 2.

In the above embodiment, a flexible printed circuit board connecting the IC contact block and the control board 13 may be formed as in the FPC 19. That is, the flexible printed circuit board connecting the IC contact block and the control board 13 may include the first data signal circuit layer 32*a* and the first destruction detection circuit layer 34*a*. In this case, the card reader main body 3 does not necessarily have to include the magnetic head 7. Also, the flexible printed circuit board to which at least an embodiment of the present invention is applicable may be used in other devices than the card reader 1.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:
1. A flexible printed circuit board, comprising:
   a data signal circuit layer on which a data signal circuit structured to transfer data signals is formed; and
   a destruction detection circuit layer on which a destruction detection circuit, structured to detect at least one of a break and a short-circuit of the destruction detection circuit layer, is formed, the destruction detection circuit layer overlapping the data signal circuit layer, wherein the destruction detection circuit is structured to carry destruction detection signals which are squarewave-shaped digital signals, the data signal circuit layer comprises a first data signal circuit layer on which the data signal circuit is formed, the data signal circuit comprising a plurality of linear-shaped first pattern wirings arranged parallel to one another, and the destruction detection circuit comprises a first destruction detection circuit layer comprising second pattern wirings formed by a combination of linear portions orthogonally crossing the first pattern wirings and arcuate portions.

2. The flexible printed circuit board according to claim 1, wherein the destruction detection circuit layer is formed on one side of the data signal circuit layer in a thickness direction of the flexible printed circuit board.

3. The flexible printed circuit board according to claim 1, wherein the destruction detection circuit comprises an outward pattern wiring and an inward pattern wiring pulled around between a first end and a second end in a longitudinal direction of the flexible printed circuit, and the outward pattern wiring and the inward pattern wiring are connected to each other at the second end in the longitudinal direction of the flexible printed circuit board.

4. The flexible printed circuit board according to claim 3, wherein the outward pattern wiring comprises a plurality of first protruding portions protruding toward a second end from a first end in a width direction of the flexible printed circuit board, and having the linear portions, and the inward pattern wiring comprises a plurality of second protruding portions protruding toward the first end from the second end in the width direction of the flexible printed circuit board, and having the linear portions.

5. The flexible printed circuit board according to claim 4, wherein the first protruding portions and the second protruding portions are arranged alternately adjacent to each other in the longitudinal direction of the flexible printed circuit board.

6. The flexible printed circuit board according to claim 5, wherein the outward pattern wiring comprises a first connecting portion that connects two of the first protruding portions arranged adjacent to each other in the longitudinal direction of the flexible printed circuit board at the first end in the width direction of the flexible printed circuit board, the inward pattern wiring comprises a second connecting portion that connects two of the second protruding portions arranged adjacent to each other in the longitudinal direction of the flexible printed circuit board at the second end in the width direction of the flexible printed circuit board, and the first connecting portion and the second connecting portion each are formed in a wave shape formed by a plurality of arcuate portions.

7. The flexible printed circuit board according to claim 5, wherein each of the first protruding portions and each of the second protruding portions comprise a plurality of linear portions and arcuate portions connecting the linear portions, and at least one of the arcuate portions of each of the first protruding portions and at least one of the arcuate portions of each of the second protruding portions are arranged adjacent to each other in the width direction of the flexible printed circuit board.

8. A card reader that performs at least one of reading data recorded on a card and recording data on a card, comprising a flexible printed circuit board comprising:

a data signal circuit layer on which a data signal circuit structured to transfer at least one of signals of data read from the card and signals of data to be recorded on the card is formed, and a destruction detection circuit layer on which a destruction detection circuit structured to detect at least one of a break and a short-circuit of the destruction detection circuit layer is formed, the destruction detection circuit layer overlapping the data signal circuit layer, wherein the destruction detection circuit is structured to carry destruction detection signals which are squarewave-shaped digital signals, the data signal circuit layer comprises a first data signal circuit layer on which the data signal circuit is formed, the data signal circuit comprising a plurality of linear-shaped first pattern wirings arranged parallel to one another, and the destruction detection circuit comprises a first destruction detection circuit layer comprising second pattern wirings formed by a combination of linear portions and orthogonally crossing the first pattern wirings and arcuate portions.

9. The card reader according to claim 8, further comprising a magnetic head structured to perform at least one of reading magnetic data recorded on the card and recording magnetic data on the card, wherein the flexible printed circuit board is connected to the magnetic head, and the data signal circuit transfers signals of the magnetic data.

* * * * *